(12) United States Patent
Patel

(10) Patent No.: US 8,294,252 B1
(45) Date of Patent: Oct. 23, 2012

(54) STACKED SEMICONDUCTOR SUBSTRATES

(75) Inventor: Rakesh H. Patel, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 247 days.

(21) Appl. No.: 12/431,625

(22) Filed: Apr. 28, 2009

Related U.S. Application Data

(63) Continuation-in-part of application No. 11/969,373, filed on Jan. 4, 2008, now Pat. No. 8,000,106, and a continuation-in-part of application No. 11/897,916, filed on Aug. 31, 2007, now abandoned.

(60) Provisional application No. 60/842,116, filed on Aug. 31, 2006.

(51) Int. Cl.
H01L 23/02 (2006.01)

(52) U.S. Cl. ........ 257/686; 257/777; 257/723; 438/109; 438/110

(58) Field of Classification Search .................. 257/777, 257/686, 778, 737, 738, 723, 774, 776, 734, 257/779, 781, 783, 784, 786, 678; 438/107, 438/108, 109, 110, 106, 112, 618, 612, 613, 438/614, 622; 361/735, 790
See application file for complete search history.

(56) References Cited

U.S. PATENT DOCUMENTS

| 7,279,795 | B2 * | 10/2007 | Periaman et al. | 257/777 |
| 7,335,972 | B2 * | 2/2008 | Chanchani | 257/686 |
| 7,598,617 | B2 * | 10/2009 | Lee et al. | 257/777 |
| 7,759,800 | B2 * | 7/2010 | Rigg et al. | 257/774 |
| 2003/0062620 | A1 * | 4/2003 | Shibata | 257/723 |
| 2004/0040005 | A1 * | 2/2004 | Carison | 716/8 |
| 2005/0184399 | A1 * | 8/2005 | Damberg et al. | 257/777 |

* cited by examiner

Primary Examiner — Ha Tran I Nguyen
Assistant Examiner — Thanh Y Tran
(74) Attorney, Agent, or Firm — Ward & Zinna, LLC

(57) ABSTRACT

A semiconductor system in a package in which at least first and second semiconductor substrates are mounted one above the other on a package substrate. The first substrate is mounted on the package substrate with its active (or front) side facing the package substrate. A plurality of through-silicon-vias (TSVs) extend through one or more peripheral regions of the first substrate; and a redistribution layer is located on the back side of the first substrate and connected to the TSVs. The second substrate is mounted on the first substrate and electrically connected to circuits in the active side of the first substrate through the redistribution layer and the TSVs. Illustratively, one of the substrates is an FPGA and one or more of the other substrates stores the configuration memory and/or other functional memory for the FPGA. Advantageously, design costs are reduced by using pre-existing designs and modifying them as needed to provide TSVs along the periphery of the circuit.

14 Claims, 6 Drawing Sheets

STACKED SEMICONDUCTOR SUBSTRATES

CROSS-REFERENCE TO RELATED APPLICATIONS

This application is a continuation-in-part of application Ser. No. 11/969,373, filed Jan. 4, 2008 now U.S. Pat. No. 8,000,106 for "Circuit Distribution to Multiple Integrated Circuits" and application Ser. No. 11/897,916, filed Aug. 31, 2007 now abandoned for "Die Partitioning and Leveraging," both of which are hereby incorporated by reference in their entirety. Application Ser. No. 11/897,916 claims benefit of the Aug. 31, 2006 filing date of provisional application No. 60/842,116.

BACKGROUND

The present invention relates generally to an electronic package and a method for making it and, in particular, to an electronic package in which multiple integrated circuits are stacked one above another. A particular application for this package is in the implementation of field programmable gate arrays (FPGA) and the invention will be described in that context.

BACKGROUND OF THE INVENTION

As integrated circuits have become faster and more complicated over the past 50 years, the need for more and more input/output pins both at the circuit level and at the package level has grown inexorably. One such integrated circuit where this problem is acute is the FPGA.

A FPGA is a programmable logic device containing a large number of small programmable logic elements, a number of input/output (I/O) terminals, and a method of specifying electrical connections between the logic elements through a distributed array of programmable switches. The programming of the logic elements and the switches is typically specified by configuration bits stored in a configuration random access memory (CRAM). A FPGA allows a design engineer to realize a design of a product by programming its connections in a specific manner without incurring the high cost of manufacturing a unique integrated circuit, an especially attractive alternative as the costs of circuit design have continued to mount. A variety of FPGAs are described in S. D. Brown, R. J. Francis, J. Rose, and Z. G. Vranesic, *Field-Programmable Gate Arrays*, (Kluwer Academic Publishers 1992); J. H. Jenkins, *Designing with FPGAs and CPLDs*, (PTR Prentice-Hall 1994); J. V. Oldfield and R. C. Dorf, *Field Programmable Gate Arrays*, (Wiley-Interscience 1995).

FIGS. 1 and 2 illustrate the general layout of certain FPGAs supplied by Altera Corporation, the assignee of the present application. FIG. 1 depicts a programmable logic device 20 comprising logic array blocks (LAB) 22. Device 20 is implemented as a single integrated circuit. Each logic array block 22 comprises a group of logic elements (LE) 24 which is frequently referred to as core logic. Around the periphery of the programmable logic device 20 are input/output elements (IOE) 26. Each logic element 24 and input/output element 26 can generate one or more signals that can be routed to other logic elements 24 or input/output elements 26 through vertical (or column) interconnect circuitry 28 and horizontal (or row) interconnect circuitry 30. The interconnect circuitry (or bus) is located in one or more metallization layers of the integrated circuit. The number of LABs 22 shown in programmable logic device 20 of FIG. 1 is only illustrative. In practice, logic device 20 could have fewer LABS and often has more.

FIG. 2 is a more detailed view of a logic array block (LAB) 22. LAB 22 a set of logic elements (LE1-LE8). Local interconnect circuitry 31 routes signals generated within the LAB 22 (or signals generated externally to LAB 22 which have been routed to this LAB) to the logic elements 24 within that LAB. Multiplexers 32 provide for various connections between LAB 22 and the vertical and horizontal circuitry 28, 30. Various programmable switches (not shown), which may include multiplexers, provide a variety of interconnections among the logic elements.

In addition to the logic elements 24, input/output elements 26, interconnect circuitry 28, 30, local interconnect circuitry 31, and multiplexers 32, a FPGA typically includes configuration memory (CRAM), a control block, at least one digital signal processor (DSP), a clock, and at least one phase lock loop (PLL). Other circuits may also be incorporated into the FPGA.

Like all integrated circuits, the minimum feature size of the individual circuits in a FPGA has been steadily reduced since the first FPGAs were introduced approximately 20 years ago; and, as a result, more and more individual circuits have been formed in the same area of a FPGA. This has led to the need for additional input/output ports, both for connection of the FPGA to external circuitry and for connection to the CRAM memory needed to control the multiplexers and switches of the FPGA

SUMMARY

I have devised a semiconductor system in a package in which at least first and second semiconductor substrates are mounted one above the other on a package substrate. The first substrate is mounted on the package substrate with its active (or front) side facing the package substrate. A plurality of through-silicon-vias extend through one or more peripheral regions of the first substrate; and a redistribution layer is located on the back side of the first substrate and connected to the through-silicon-vias. The second substrate is mounted on the first substrate and electrically connected to circuits in the active side of the first substrate through the redistribution layer and the through-silicon-vias. Illustratively, the circuits of one of the substrates are those of an FPGA and the circuits of one or more of the other substrates are memory circuits that are large enough and fast enough to meet the requirements for the CRAM and any additional memory of the FPGA.

Numerous variations may be practiced. For example, a plurality of semiconductor substrates may be mounted side-by-side on the first substrate and connected to circuits on the front side of the first substrate through one or more redistribution layers and through-silicon-vias. Alternatively, multiple semiconductor substrates may be stacked one above the other on the first substrate. In this alternative, intermediate substrates may also have through-silicon-vias that extend through one or more of their peripheral edges and a redistribution layer on their back side so as to provide electrical connections between circuits in the upper and lower layers of the stack of substrates. In another alternative, a plurality of substrates may be mounted side-by-side on the package substrate with their active sides facing the package substrate; and one or more substrates may be mounted on the plurality of substrates. Again, a plurality of through-silicon-vias extend through one or more peripheral regions of at least one of the substrates mounted on the package substrate and a redistribution layer is located on its back side, thereby providing for electrical connections between the circuits in the substrates of the upper layer and those of the substrates below. In another alternative, the substrates may be mounted side-by-side on the package substrate with their back sides facing the package substrate.

Advantageously, design costs for the package are minimized by using pre-existing circuit designs and pre-existing circuits wherever feasible. Thus, in some embodiments, a circuit with through-silicon-vias is formed by adding the vias to the periphery of an off-the-shelf integrated circuit and connecting them to the circuitry of the integrated circuit. Such a package is formed by modifying a pre-existing circuit design to add the through-silicon-vias along at least one peripheral edge of the circuit, fabricating the integrated circuit in accordance with the modified design, forming a redistribution layer on the back side of the integrated circuit and connected to the through-silicon-vias, mounting the integrated circuit on a package substrate with its active side facing the package substrate, and mounting a second integrated circuit on the first integrated circuit such that circuits in the second integrated circuit are electrically connected to circuits in the first integrated circuit.

BRIEF DESCRIPTION OF THE DRAWINGS

These and other objects, features and advantages of the present invention will be more readily apparent from the following Detailed Description in which.

DETAILED DESCRIPTION

Figure 1:
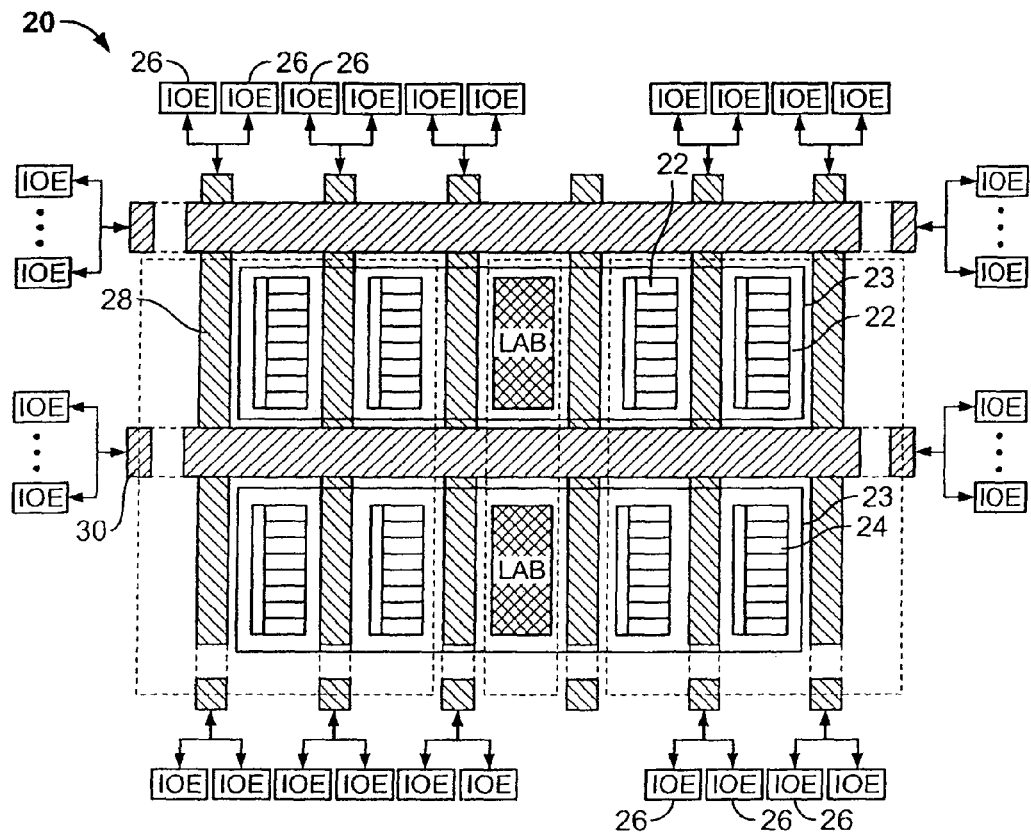
FIG. 1 is a schematic representation of a prior art FPGA.
Figure 2:
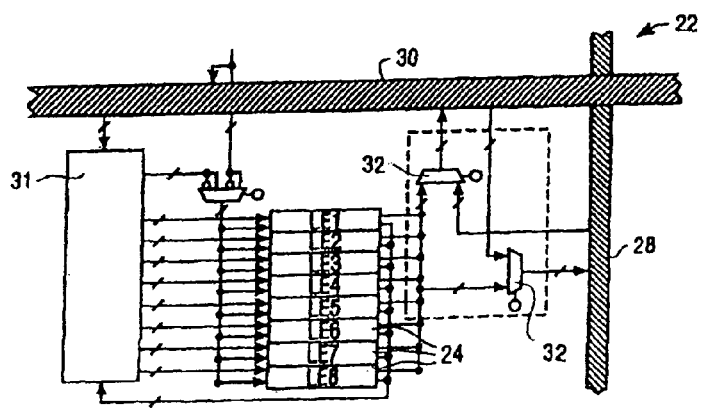
FIG. 2 is a schematic representation of a portion of the FPGA of FIG. 1.
Figure 3A:
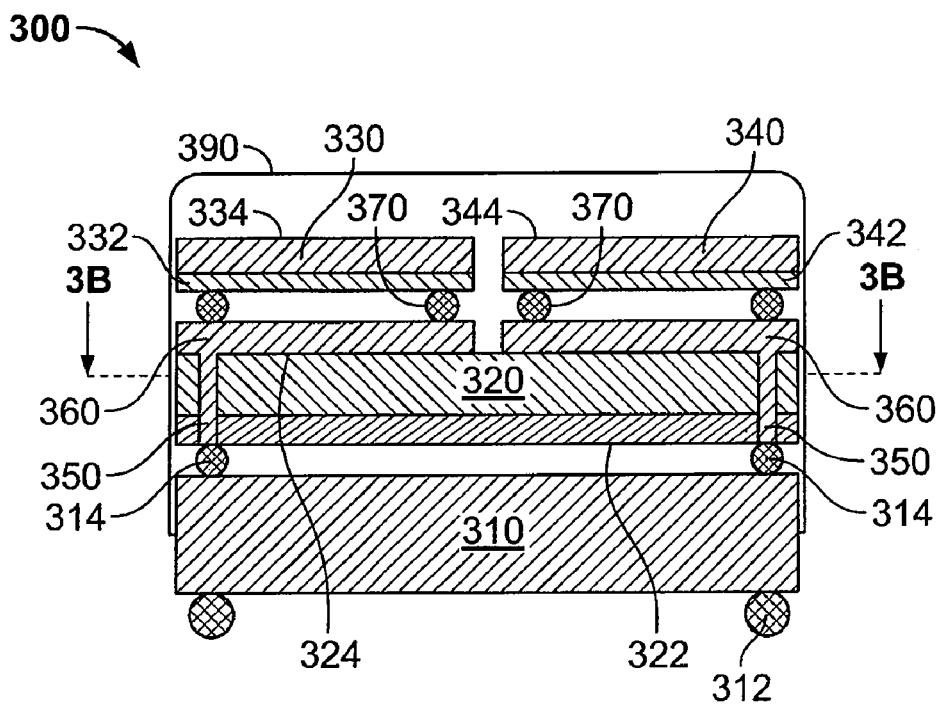
FIGS. 3A and 3B are representations of a first illustrative embodiment of the invention.
Figure 3B:
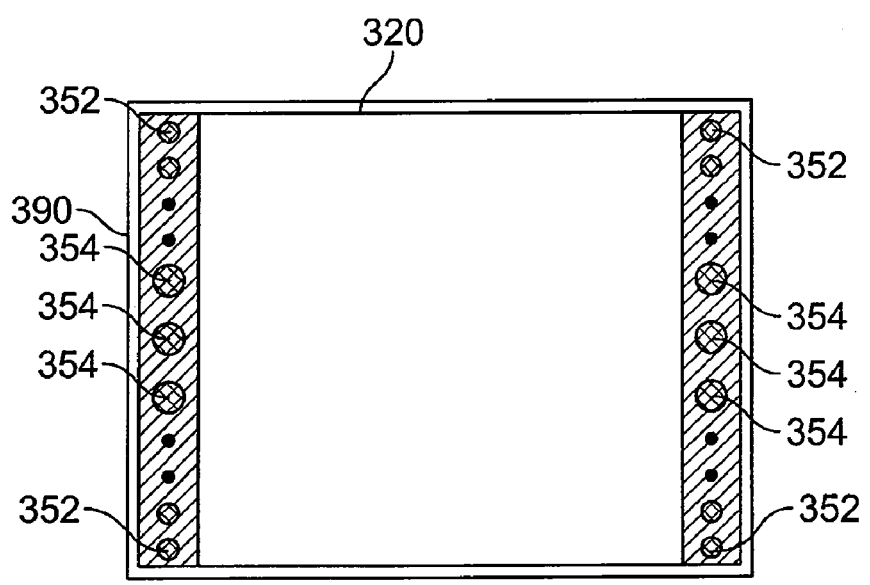

FIGS. 3A and 3B depict a system in a package in a first illustrative embodiment of the invention. FIG. 3A is a vertical section through the system; and FIG. 3B is a horizontal section along lines 3B-3B. System 300 comprises a package substrate 310, first, second and third semiconductor substrates 320, 330 and 340 and an enclosure 390 that surrounds the substrates. Package substrate has external signal, power and ground connections through solder balls or solder bumps 312. Substrate 320 has first and second major surfaces 322, 324 with circuits defined in the first major surface 322, which is also known as the front side or active surface. Likewise, substrate 330 has first and second major surfaces 332, 334; and substrate 340 has first and second major surfaces 342, 344. Again, circuits are defined in the first major surfaces 332, 342.

Illustratively, the circuits of the first semiconductor substrate are the circuits of a field programmable gate array (FPGA) such as the Stratix® FPGA series sold by Altera Corporation of San Jose, Calif. In accordance with the present invention, the substrate has been modified to add a plurality of through-silicon-vias 350 along one or more peripheral edges of the substrate. The through-silicon-vias include both I/O signal vias 352 and larger diameter power and ground vias 354. The substrate has been further modified to include a backside redistribution layer 360 on the second major surface (or backside) 324 that connects to the through-silicon-vias 350.

Substrate 320 is mounted on package substrate 310 with its first major surface facing the package substrate. Illustratively, substrate 320 is mechanically and electrically connected to the package substrate by an array of solder balls or solder bumps 314. The I/O signal vias 352 are connected to the circuits in the first major surface 322 either directly through signal paths in interconnection layers in the first major surface or indirectly through the solder balls or solder bumps 314 and circuitry in the package substrate 310.

Illustratively, the circuits of the second and third semiconductor substrates 330, 340 are standard, mass-produced memory circuits such as DDR, RLDRAM, QDR, etc. that are widely available from numerous sources such as Samsung, Hyundai, Elpida, Micron, etc. Substrates 330 and 340 are mounted side-by-side on substrate 320 with their first major surfaces facing the second major surface of the first substrate. Illustratively, substrates 330 and 340 are mechanically and electrically connected to substrate 320 by an array of solder balls or solder bumps 370 in the region between substrate 320 and substrates 330, 340. The array of solder balls or solder bumps provide electrical connections between the circuits in the first major surfaces 332, 342 of substrates 330, 340 and the redistribution layer 360 that, in turn, are connected to the through-silicon-vias 350 that are connected to the circuits in the first major surface of the first substrate. The use of redistribution layer 360 provides considerable flexibility in connecting the through-silicon-vias to the signal, power and ground connections of substrates 330, 340.

By providing memory circuits within the package, system 300 significantly reduces the need for input/output ports that would otherwise be needed in the substrate package. By locating the through-silicon-vias on the peripheral edges of the FPGA, it becomes possible to incorporate the vias into pre-existing FPGA circuit designs with little or no modification to the FPGA circuitry. Moreover, since the I/O buffers of FPGA circuits are typically near the periphery of the circuitry, connections between the I/O buffers and the through-silicon-vias have short path lengths and are relatively easy to implement. In addition, the power required to drive these links is reduced relative to the power that would be required to drive the links if the links were to go from the I/O buffers out of the package and onto board traces to an external memory and return via the board traces and package to the I/O buffers.

Figure 4A:
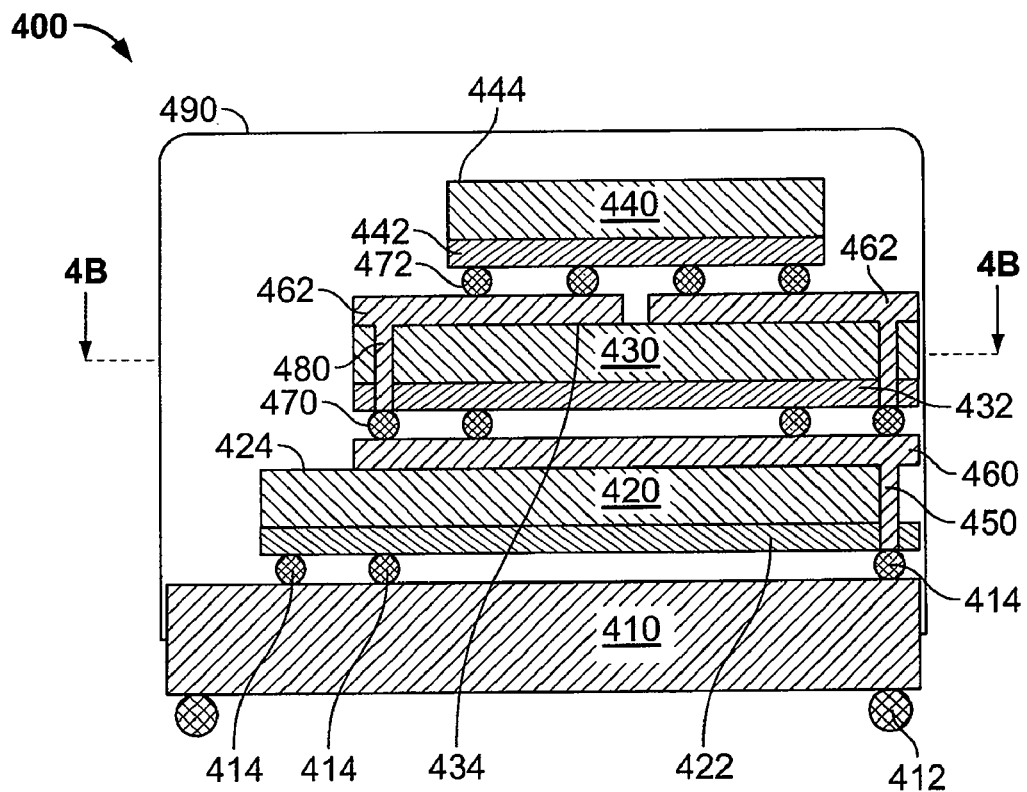
FIGS. 4A and 4B are representations of a second illustrative embodiment of the invention.
Figure 4B:
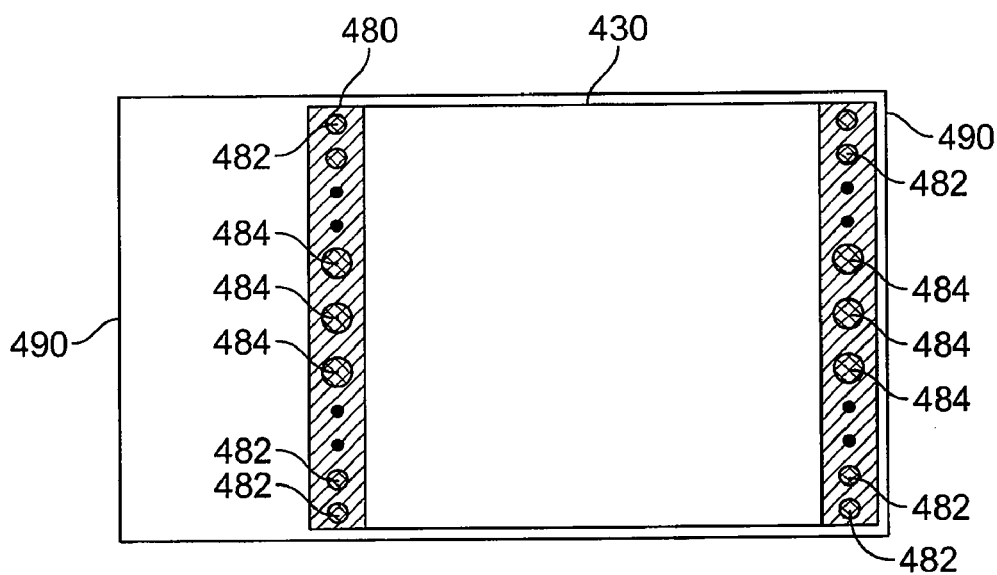

FIGS. 4A and 4B depict a system in a package in a second illustrative embodiment of the invention. FIG. 4A is a vertical section through the system; and FIG. 4B is a horizontal section along lines 4B-4B. As will be apparent, system 400 is similar to system 300 but has multiple stacked layers. System 400 comprises a package substrate 410, first, second and third semiconductor substrates 420, 430, and 440, and an enclosure 490 that surrounds the substrates. Package substrate 410 has external signal, power and ground connection through solder balls or solder bumps 412. Substrate 420 has first and second major surfaces 422, 424 with circuits defined in the first major surface 422, which is also known as the front side or active surface. Substrate 430 has first and second major surfaces 432, 434; and substrate 440 has first and second major surfaces 442, 444. Again, circuits are defined in the first major surfaces 432, 442.

Illustratively, the circuits of the first semiconductor substrate are the circuits of a field programmable gate array (FPGA). Again, the substrate has been modified to add a plurality of through-silicon-vias 450 along one or more peripheral edges of the substrate. The through-silicon-vias include I/O signal vias 452 and power and ground vias 454. The substrate has been further modified to include a backside redistribution layer 460 on the seond major surface (or backside) 424 that connects to the through-silicon-vias 450.

Substrate 420 is mounted on package substrate 410 with its first major surface facing the package substrate. Substrate 420 is mechanically and electrically connected to the package substrate by an array of solder balls or solder bumps 414; and the I/O signal vias 452 are connected to the circuits in the first major surface 422 either directly through signal paths in interconnection layers in the first major surface or indirectly through the solder balls or solder bumps 414 and circuitry in the package substrate 410.

Illustratively, the circuits of the second and third substrates 430, 440 are standard, mass-produced memory circuits. However, in accordance with the invention, at least substrate 430 has been modified to add a plurality of through-silicon-vias 480 along one or more peripheral edges of the circuit. The through-silicon-vias 480 include I/O signal vias 482 and power and ground vias 484. The substrate has been further modified to include a backside redistribution layer 462 on the second major surface 434 that connects to the through-silicon-vias 480. If desired, similar changes could also be made in substrate 440.

Substrate 430 is mounted on substrate 420 and substrate 440 is mounted on substrate 430 with their first major surfaces 432, 442 facing the second major surface 424 of the first substrate. Illustratively, substrate 430 is mechanically and electrically connected to substrate 420 by an array of solder balls or solder bumps 470 in the region between substrate 420 and substrate 430. The array of solder balls or solder bumps provides electrical connections between the circuits in the first major surface 432 of substrate 430 including through-silicon-vias 480 and the redistribution layer 460 that, in turn, are connected to the through-silicon-vias 450 that are connected to the circuits in the first major surface of the first substrate. Illustratively, substrate 440 is mechanically and electrically connected to substrate 430 by an array of solder balls or solder bumps 472 in the region between substrate 430 and substrate 440. The array of solder balls or solder bumps provides electrical connections between the circuits in the first major surface 442 of substrate 440 and the redistribution layer 462 that, in turn, are connected to the through-silicon-vias 480 that are connected to redistribution layer 460.

As in the case of system 300, system 400 significantly reduces the need for input/output ports that would otherwise be needed in the substrate package.

Figure 5:
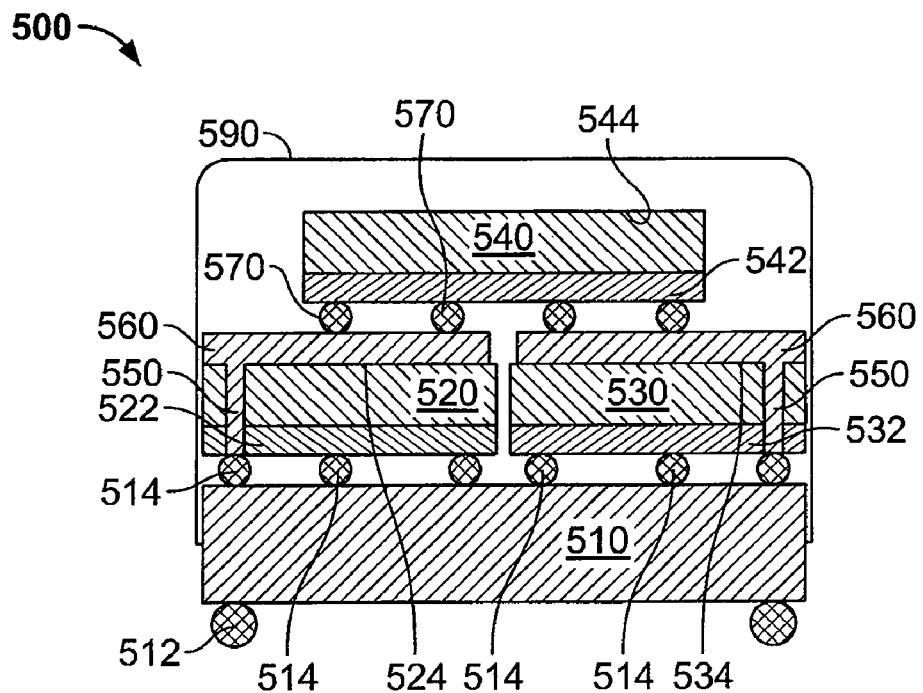
FIG. 5 is a representation of a third illustrative embodiment of the invention.

FIG. 5 depicts a vertical cross-section of system in a package in a third illustrative embodiment of the invention. System 500 is similar to system 300 but the substrates are interchanged in position. System 500 comprises a package substrate 510, first, second and third semiconductor substrates 520, 530 and 540, and an enclosure 590 that surrounds the substrates. Package substrate 510 has external signal, power and ground connection through solder balls or solder bumps 512 Each substrate 520, 530, 540 has first and second major surfaces 522, 524; 532, 534; 542, 544, respectively, with circuits defined in the first major surface.

Illustratively, the circuits of the first and second semiconductor substrates are the circuits of standard, mass-produced memory circuits. In accordance with the present invention, each substrate 520, 530 has been modified to add a plurality of through-silicon-vias 550 along one or more peripheral edges of the substrate. The through-silicon-vias include I/O signal vias and power and ground vias. The substrates have been further modified to include backside redistribution layers 560 on the second major surfaces (or backside) 524, 534 that connect to the through-silicon-vias 550. In some applications, it may also be advantageous to further enhance memory access by the use of front side redistribution layers that connect memory I/O to the through-silicon-vias 552.

Substrates 520, 530 are mounted side-by-side on package substrate 510 with their first major surface facing the package substrate. Illustratively, substrates 520, 530 are mechanically and electrically connected to the package substrate by an array of solder balls or solder bumps 514. The I/O signal vias are connected to the circuits in the first major surfaces 522, 532 through signal paths in interconnection layers in the first major surfaces. The power and ground vias are connected to the package substrate.

Substrate 540 is mounted on substrates 520, 530 with its first major surface facing the second major surfaces of the first and second substrates Illustratively, substrate 540 is mechanically and electrically connected to substrate 520 by an array of solder balls or solder bumps 570 in the region between substrate 540 and substrates 520, 530. The array of solder balls or solder bumps provides electrical connections between the circuits in the first major surface 542 of substrate 540 and the redistribution layers 560 that, in turn, are connected to the through-silicon-vias 552 that are connected to the circuits in the first major surfaces of the first and second substrates and the through-silicon-vias 554 that are connected to the package substrate.

Figure 6:
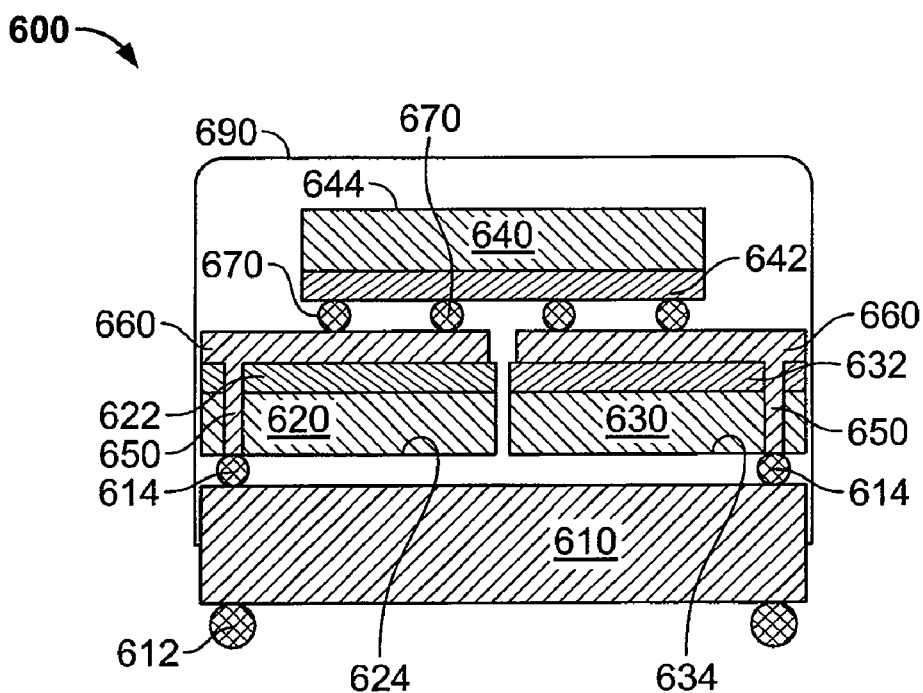
FIG. 6 is a representation of a fourth illustrative embodiment of the invention.

FIG. 6 depicts a vertical cross-section of a system in a package in a fourth illustrative embodiment of the invention. System 600 is similar to system 500 but the orientation of the first and second substrates has been flipped so that they face away from the package substrate. System 600 comprises a package substrate 610, first, second and third semiconductor substrates 620, 630, and 640 and an enclosure 690 that surrounds the substrates. Each substrate 620, 630, 640 has first and second major surfaces 622, 624; 632, 634; 642, 644, respectively, with circuits defined in the first major surface.

Illustratively, the circuits of the first and second semiconductor substrates are the circuits of standard, mass-produced memory circuits. In accordance with the present invention, each substrate 620, 630 has been modified to add a plurality of through-silicon-vias 650 along one or more peripheral edges of the substrate. The through-silicon-vias include I/O signal vias and power and ground vias. The substrates have been further modified to include front side redistribution layers 660 on the first major surfaces 622, 632 that connect to the through-silicon-vias and to the circuits in substrates 620 and 630.

Substrates 620, 630 are mounted side-by-side on package substrate 610 with their second major surfaces facing the package substrate. I/O signal vias provide I/O signal connection between substrates 620, 630, 640 and sources/sinks external to the package. Power and ground vias provide power and ground connections to upper level substrates such as substrate 640.

Substrate 640 is mounted on substrates 620, 630 with its first major surface facing the first major surfaces of the first and second substrates Illustratively, substrate 640 is mechanically and electrically connected to substrates 620, 630 by an array of solder balls or solder bumps 670 in the region between substrate 640 and substrates 620, 630. The array of solder balls or solder bumps provides electrical connections between the circuits in the first major surface 642 of substrate 640 and the redistribution layers 660 that, in turn, are connected to the circuits in the first major surfaces of the first and second substrates and to the through-silicon-vias 650 that are connected to the package substrate.

Figure 7:
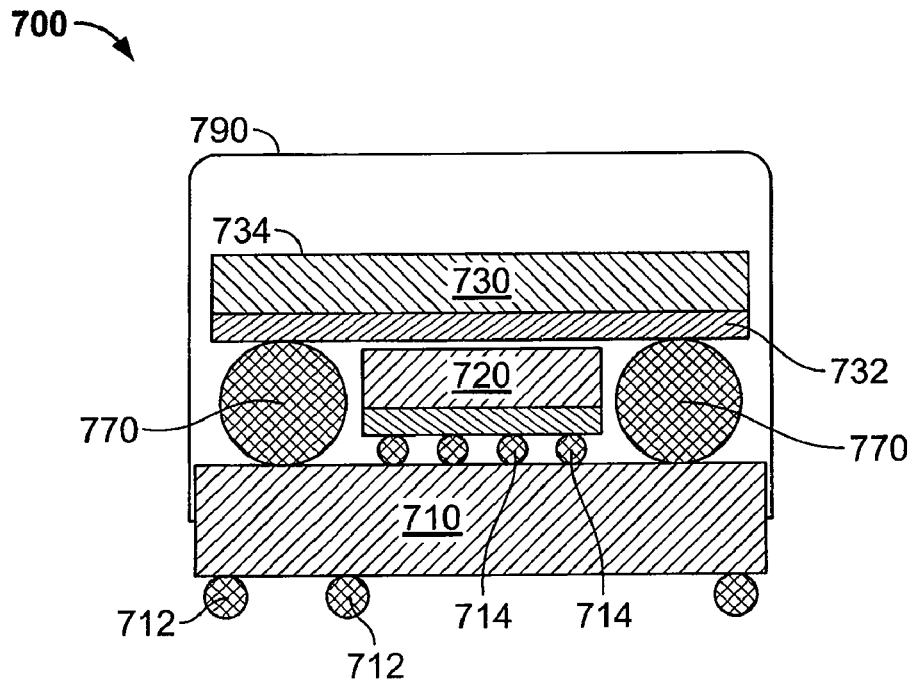
FIG. 7 is a representations of a fifth illustrative embodiment of the invention.

FIG. 7 depicts a system in a package in a fifth illustrative embodiment of the invention. System 700 comprises a package substrate 710, first and second semiconductor substrates 720 and 730, and an enclosure 790 that surrounds the substrates. Package substrate 710 has signal, power and ground connection though solder balls or solder bumps 712. Each substrate 720. 730 has first and second major surfaces 722, 724; 732, 734, respectively, with circuits defined in the first major surface. The first major surface 722 of substrate 720 faces the package substrate as shown in FIG. 7.

Illustratively, the first semiconductor substrate 720 is mechanically and electrically connected to the package substrate by an array of solder balls or solder bumps 714. The second semiconductor substrate is mounted over the first semiconductor substrate and, illustratively, is mechanically and electrically connected to the package substrate by an array of solder balls or solder bumps 770. Illustratively, the circuits of the first semiconductor substrate are memory circuits; and the circuits of the second semiconductor substrate are the circuits of a field programmable gate array (FPGA).

Figure 8:
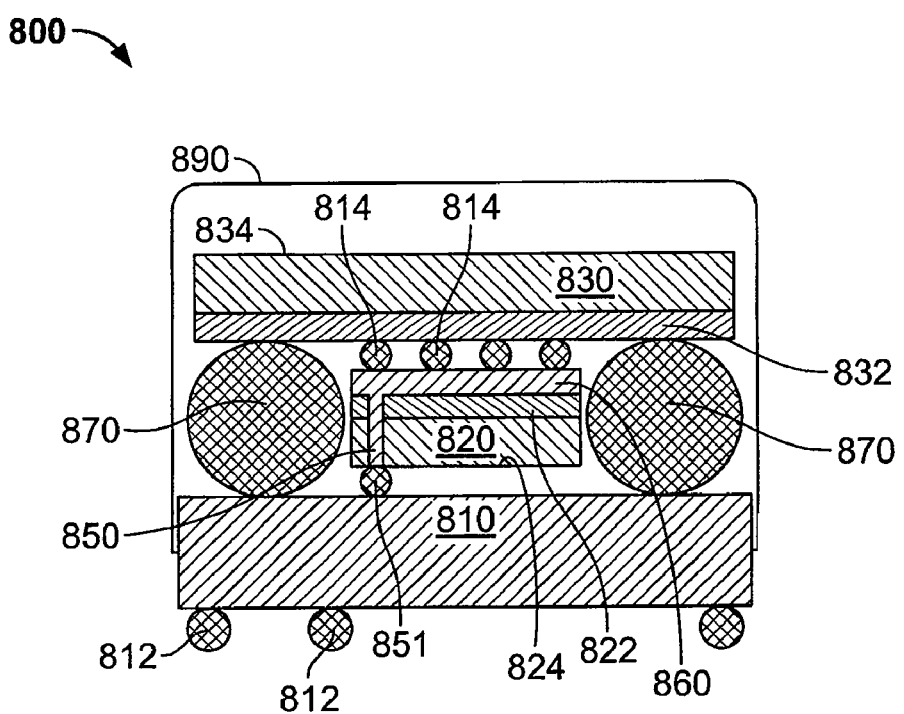
FIG. 8 is a representation of a sixth illustrative embodiment of the invention.

FIG. 8 depicts a system in a package in a sixth illustrative embodiment of the invention. System 800 is similar to system 800 but the orientation of substrate 810 has been flipped relative to the orientation of substrate 710; and substrate 810 includes a plurality of through-silicon-vias. System 800 comprises a package substrate 810, first and second semiconductor substrates 820 and 830, and an enclosure 890 that surrounds the substrates. Package substrate 810 has signal, power and ground connection though solder balls or solder bumps 812. Each substrate 820. 830 has first and second major surfaces 822, 824; 832, 834, respectively, with circuits defined in the first major surface.

Illustratively, substrate 820 has been modified to add a plurality of through-silicon-vias 850 along one or more peripheral edges of the substrate. The through-silicon-vias include I/O signal vias and power and ground vias. The substrate has been further modified to include a front side redistribution layer 860 on the first major surface 822 that connects to the through-silicon-vias and to the circuits in the first major surface of substrate 820.

Figure 9:
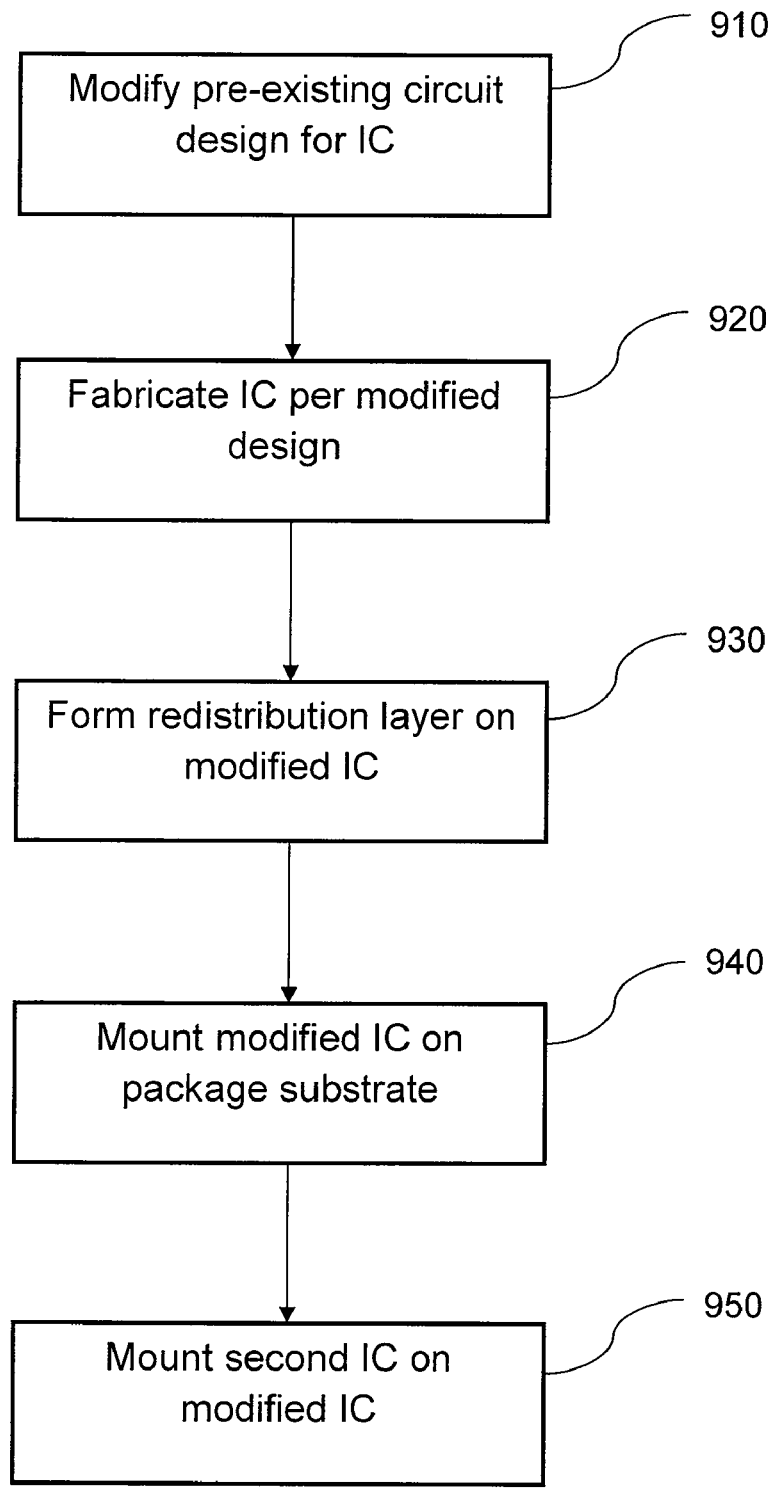
FIG. 9 is a flowchart of an illustrative embodiment of the invention.

The first semiconductor substrate 820 is mounted on the package substrate so that its first major surface faces away from the package substrate. Substrate 820 is connected electrically to package substrate 810 through redistribution layer 860, through-silicon-vias 850 illustratively, an array of solder balls or solder bumps 851. The second semiconductor substrate is mounted over the first semiconductor substrate and, illustratively, is mechanically and electrically connected to the package substrate by an array of solder balls or solder bumps 870. In addition, the active sides of the first and second substrates are directly connected by a second array 814 of solder balls or solder bumps. As will be apparent, this mounting of the two substrates in facing relationship minimizes the path length between circuits on one substrate and those on the other. Illustratively, the circuits of the first semiconductor substrate are memory circuits and the circuits of the second semiconductor substrate are the circuits of a field programmable gate array (FPGA FIG. 9 is a flowchart depicting a method of practicing the invention. At step 910, a pre-existing circuit design for an integrated circuit is modified to add a plurality of through-silicon-vias along at least one peripheral edge of the circuit. At step 920, an integrated circuit is fabricated using the modified design. At step 930, a redistribution layer is defined on the backside of the circuit so that it is connected to the through-silicon-vias. At step 940, the integrated circuit is mounted on a package substrate with its active side facing the package substrate; and at step 950 a second integrated circuit is mounted on the first integrated circuit so that circuits in the second integrated circuit are connected to circuits in the first integrated through the redistribution layer and the through-silicon-vias.

As will be apparent to those skilled in the art, numerous variations may be made in the present invention.

What is claimed is:

1. A semiconductor system in a package comprising:
   a package substrate,
   first and second semiconductor substrates, each having first and second major surfaces with a circuit defined in the first major surface, said second semiconductor substrate being positioned on top of said first semiconductor substrate and in mechanical and electrical connection therewith and said first semiconductor substrate being positioned on said package substrate and in mechanical and electrical connection therewith,
   a plurality of through-silicon-vias extending through a peripheral region of the circuit defined in the first major surface of said first semiconductor substrate between the first and second major surfaces of said first semiconductor substrate and connecting to the circuit in the first major surface,
   a redistribution layer on the second major surface of the first semiconductor substrate that connects to the through-silicon-vias, and
   connectors for connecting the redistribution layer to the circuit in the first major surface of the second semiconductor substrate,
   whereby the circuit in the first major surface of the first semiconductor substrate is connected through the through-silicon-vias, the redistribution layer and the connectors to the circuit in the first major surface of the second semiconductor substrate.

2. The system of claim 1 wherein the connectors are an array of solder bumps or solder balls.

3. The system of claim 1 wherein the first semiconductor substrate is a field programmable gate array (FPGA).

4. The system of claim 1 wherein the first semiconductor substrate is an off-the-shelf FPGA modified to provide a plurality of through-silicon-vias along at least one peripheral edge of the FPGA.

5. The system of claim 1 wherein the second substrate is a memory circuit.

6. The system of claim 1 wherein the second semiconductor substrate is an off-the-shelf memory circuit modified to provide a plurality of through-silicon-vias along at least one peripheral edge of the off-the-shelf memory circuit.

7. The system of claim 6 further comprising a redistribution layer on the second major surface of the second semiconductor substrate that connects to the through-silicon-vias in the second semiconductor substrate.

8. The system of claim 7 further comprising a third semiconductor substrate positioned on top of the second semiconductor substrate and in mechanical and electrical connection therewith.

9. The system of claim 1 further comprising a third semiconductor substrate positioned alongside said second semiconductor substrate on top of said first semiconductor substrate and in mechanical and electrical connection with the first semiconductor substrate.

10. The system of claim 9 wherein the third semiconductor substrate is electrically connected to the first semiconductor substrate through through-silicon-vias in the first semiconductor substrate and the redistribution layer on the second major surface of the first semiconductor substrate.

11. The system of claim 1 wherein the first semiconductor substrate is a memory circuit.

12. The system of claim 11 wherein the second semiconductor substrate is an FPGA circuit.

13. The system of claim 12 wherein the first major surface of the second semiconductor substrate faces the second major surface of the first semiconductor substrate.

14. The system of claim 12 where the second major surface of the second semiconductor substrate faces the second major surface of the first semiconductor substrate.

* * * * *